United States Patent [19]
Aakalu et al.

[11] Patent Number: 5,894,407
[45] Date of Patent: Apr. 13, 1999

[54] ENCLOSURES FOR HEAT PRODUCING DEVICES

[75] Inventors: Nandakumar G. Aakalu, Plesant Valley, N.Y.; Daniel Plaza, Mendham, N.J.

[73] Assignee: Lucent Technologies, Inc., Murray Hill, N.J.

[21] Appl. No.: 08/828,445

[22] Filed: Mar. 28, 1997

[51] Int. Cl.[6] .................................................. H05K 7/20
[52] U.S. Cl. ........................ 361/695; 361/692; 361/694; 361/704; 257/722; 165/80.3; 165/185
[58] Field of Search ................................ 361/688, 690, 361/694, 695, 703, 704; 165/80.3; 174/16.1, 16.3

[56] References Cited

U.S. PATENT DOCUMENTS

| 4,237,521 | 12/1980 | Denker | 361/697 |
|---|---|---|---|
| 5,054,545 | 10/1991 | Ghaemian | 165/104.33 |
| 5,513,071 | 4/1996 | LaViolette et al. | 361/703 |

*Primary Examiner*—Leo P. Picard
*Assistant Examiner*—Boris L. Chervinsky
*Attorney, Agent, or Firm*—Jimmy Goo

[57] ABSTRACT

The present invention is an enclosure with a cooling scheme for cooling heat producing devices, such as electronic components, contained within the enclosure. Specifically, the cooling scheme of the present invention shelters the enclosure from solar heat without significantly decreasing the efficiency of the convection process associated with heat sinks. In an embodiment of the present invention, the enclosure comprises a housing and a solar shield. The housing includes a plurality of heat sinks for absorbing and dissipating heat generated by the devices. Each heat sink has an interior side to which the devices are mounted and an exterior side with a plurality of fins that form first and second channels. The first channels are aligned longitudinally with the prevalent direction of airflow, and the second channels are aligned in a contrasting manner to the first channels to allow fresh air to be drawn into the first channels (through the second channels) during the convection process. Positioned over the heat sinks is the solar shield for sheltering the housing from solar heat. The solar shield includes ventilators which align with the first and second channels for allowing the passage of air into the heat sinks and heat absorbed by the heat sinks to be dissipated. To prevent overcooling, the solar shield may include regulating devices positioned over the ventilators to constrict airflow through the ventilators when the enclosure is below a particular temperature.

14 Claims, 10 Drawing Sheets

ENCLOSURES FOR HEAT PRODUCING DEVICES

FIELD OF THE INVENTION

The present invention relates generally to enclosures for cooling heat producing devices contained within and, in particular, to outdoor enclosures for convectively cooling electronic components.

BACKGROUND OF THE RELATED ART

In the development of wireless communication networks, it is desirable to provide a number of small base stations, called microcells, which would provide coverage to limited geographical areas. One implementation of such microcells involves the packaging of electronic components associated with the base stations into small outdoor enclosures. However, most enclosures tend to trap heat which may be detrimental to the electronic components, particularly to integrated circuits and microprocessor chips.

Generally, outdoor enclosures containing any electronic components are subject to two forms of heat: heat generated by the electronic components and solar heat. To alleviate the enclosures from the former form of heat, a prior art cooling scheme includes heat sinks to which the electronic components are mounted. In this prior art cooling scheme, the heat generated by the electronic components is absorbed by the heat sinks and dissipated by a process known as convection, i.e., the heat absorbed by the heat sinks is carried away by air flowing through the heat sink.

To alleviate the enclosures from solar heat, a prior are cooling scheme includes covering the enclosures with solar shields that will shelter the enclosures (and electronic components contained within) from the solar heat. However, using the solar shields in combination with the heat sinks, in most cases, can significantly decrease the overall efficiency of the convection process. Specifically, when positioned over the heat sinks, the solar shields tend to disrupt or impede the flow of air into the heat sinks, thereby obstructing the convection process. Accordingly, there exist a need for an enclosure with a cooling scheme for heat producing devices that shelters the enclosures from solar heat without significantly decreasing the efficiency of the convection process associated with heat sinks.

SUMMARY OF THE INVENTION

The present invention is an enclosure with a cooling scheme for cooling heat producing devices, such as electronic components, contained within the enclosure. Specifically, the cooling scheme of the present invention shelters the enclosure from solar heat without significantly decreasing the efficiency of the convection process associated with heat sinks. In an embodiment of the present invention, the enclosure comprises a housing and a solar shield. The housing includes a plurality of heat sinks for absorbing and dissipating heat generated by the devices. Each heat sink has an interior side to which the devices are mounted and an exterior side with a plurality of fins that form first and second channels. In one embodiment, the first channels are aligned longitudinally with the prevalent direction of airflow, and the second channels are aligned in a contrasting manner to the first channels to allow fresh air to be drawn into the first channels (through the second channels) during the convection process. Positioned over the heat sinks is the solar shield for sheltering the housing from solar heat. The solar shield includes ventilators which align with the first and second channels for allowing the passage of air into the heat sinks and heat absorbed by the heat sinks to be dissipated.

Advantageously, the present invention may include regulating devices to prevent overcooling of the devices in the enclosure. In an embodiment of the present invention, the regulating device constricts airflow into the heat sink by partially or fully obstructing the ventilators. One embodiment of the regulating device includes a plurality of bi-metal foils comprising a top metal layer with a temperature coefficient $\alpha_T$ and a bottom metal layer with a temperature coefficient $\alpha_B$, wherein $\alpha_T$ is less than $\alpha_B$. In this embodiment, the top metal layer does not expand at low temperatures but does expand at normal temperatures, whereas the bottom metal layer does not expand at either low or normal temperatures.

BRIEF DESCRIPTION OF THE DRAWINGS

The features, aspects, and advantages of the present invention will become better understood with regard to the following description, appended claims, and accompanying drawings where:

DETAILED DESCRIPTION

The present invention is an enclosure with a scheme for convectively cooling heat producing devices, such as electronic components, housed within the enclosure. In one embodiment, the enclosure is an microcell which houses electronic components associated with a base station. In this embodiment, the microcell will generally be mounted outdoors in an elevated position where a light wind (3–5 miles per hour) is typically present in the vicinity of the microcell. The convective cooling scheme of the microcell harnesses the wind and buoyancy to dissipate heat generated by the base station electronic components. For purposes of discussion, the present invention will be described herein with respect to the microcell. This should not be construed, however, to limit the present invention to a microcell for convectively cooling base station electronic components housed within the microcell.

Figure 1:
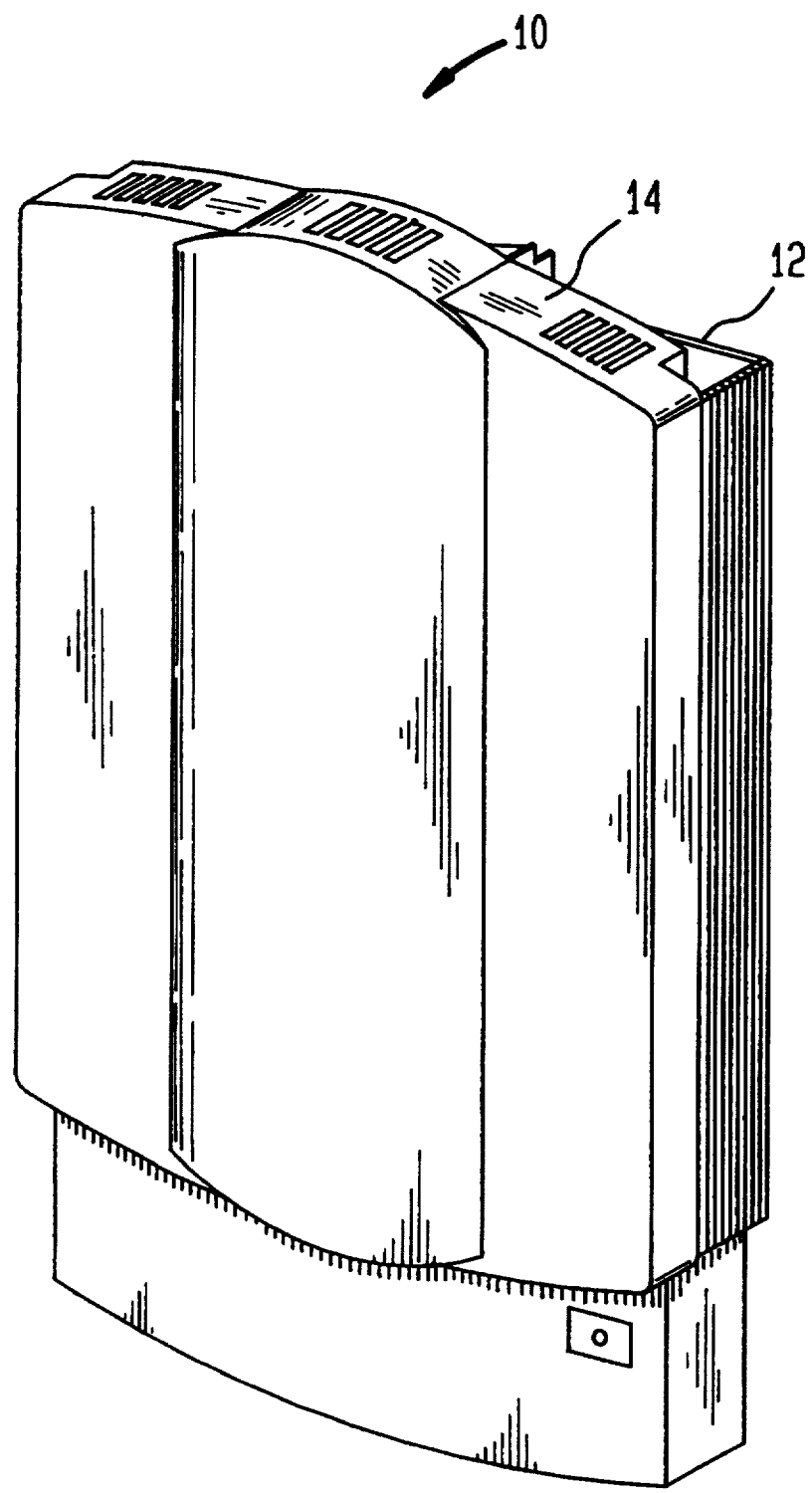
FIG. 1 depicts a microcell in a closed position in accordance with one embodiment of the present invention.
Figure 2:
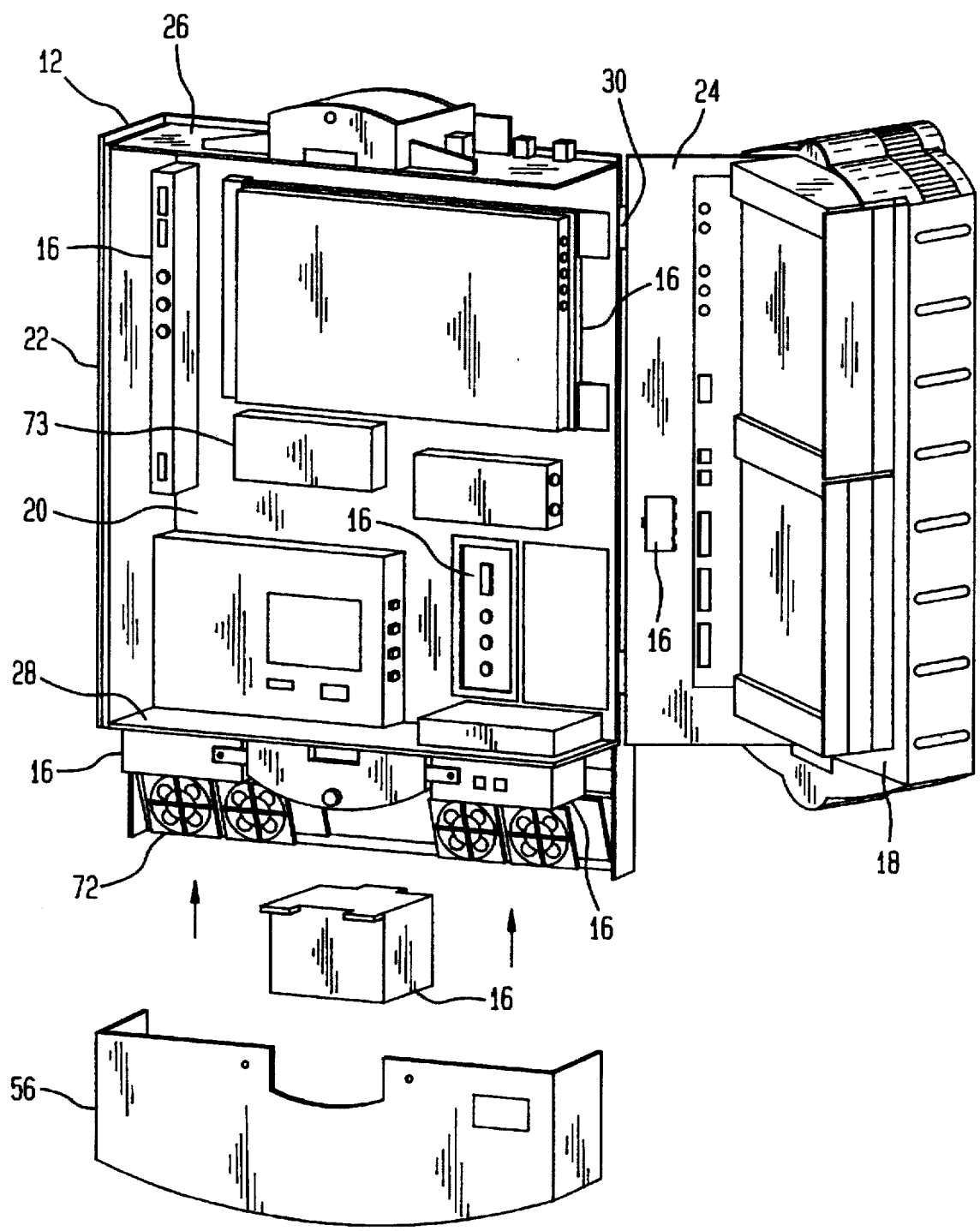
FIG. 2 depicts the microcell of FIG. 1 in an open position.

Referring to FIGS. 1–2, there are shown a microcell 10 in a closed and an open position in accordance with one embodiment of the present invention. As shown in FIGS. 1–2, the microcell 10 comprises a housing 12 and a solar shield 14. Mounted to the interior of the housing 12 are a plurality of base station electronic components 16, such as printed circuit boards (e.g., DRM, LIU, etc.), a duplex filter, an oscillator module, a power converting unit (PCU), a power amplifier, etc. The housing 12 comprises a front panel 18, a rear panel 20, a first side panel 22, a second side panel 24, a top panel 26, and a bottom panel 28. The second panel 24 is connected to the rear panel 20 by hinges 30, which permit the microcell to swing between the open and closed position.

Figure 3:
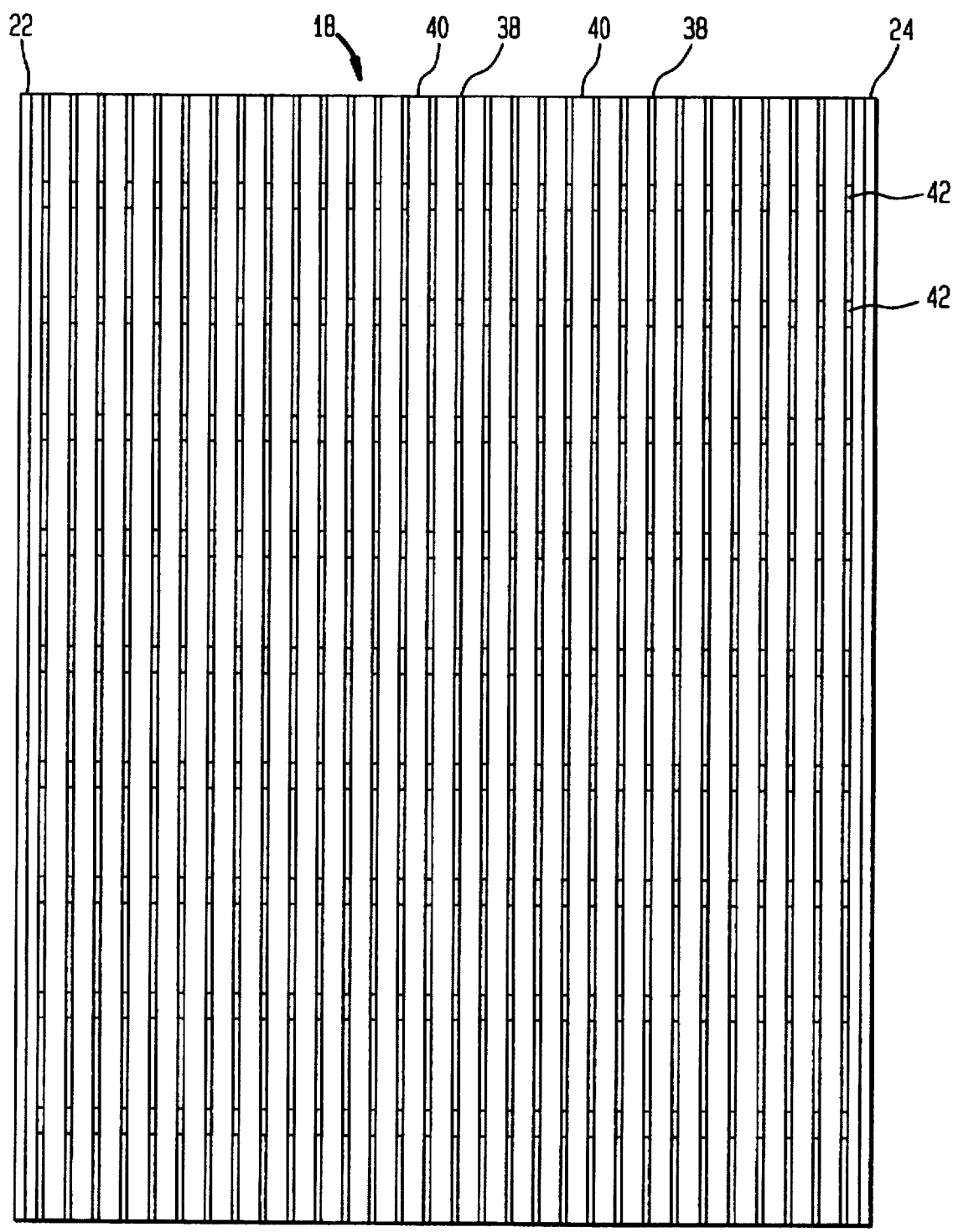
FIGS. 3–5 depict a front, a side, and a top view of the microcell of FIG. 1 without a solar shield.
Figure 4:
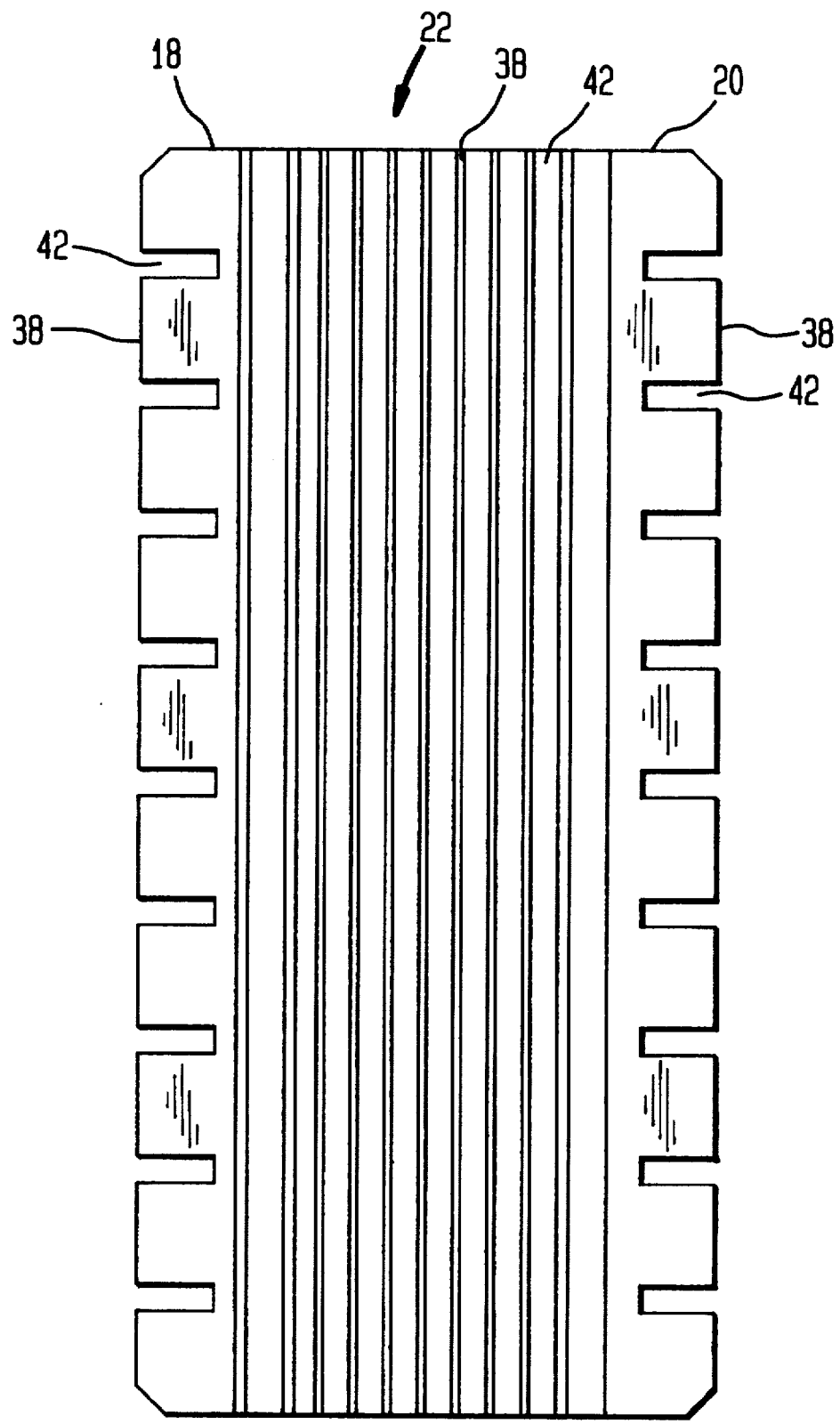
Figure 5:
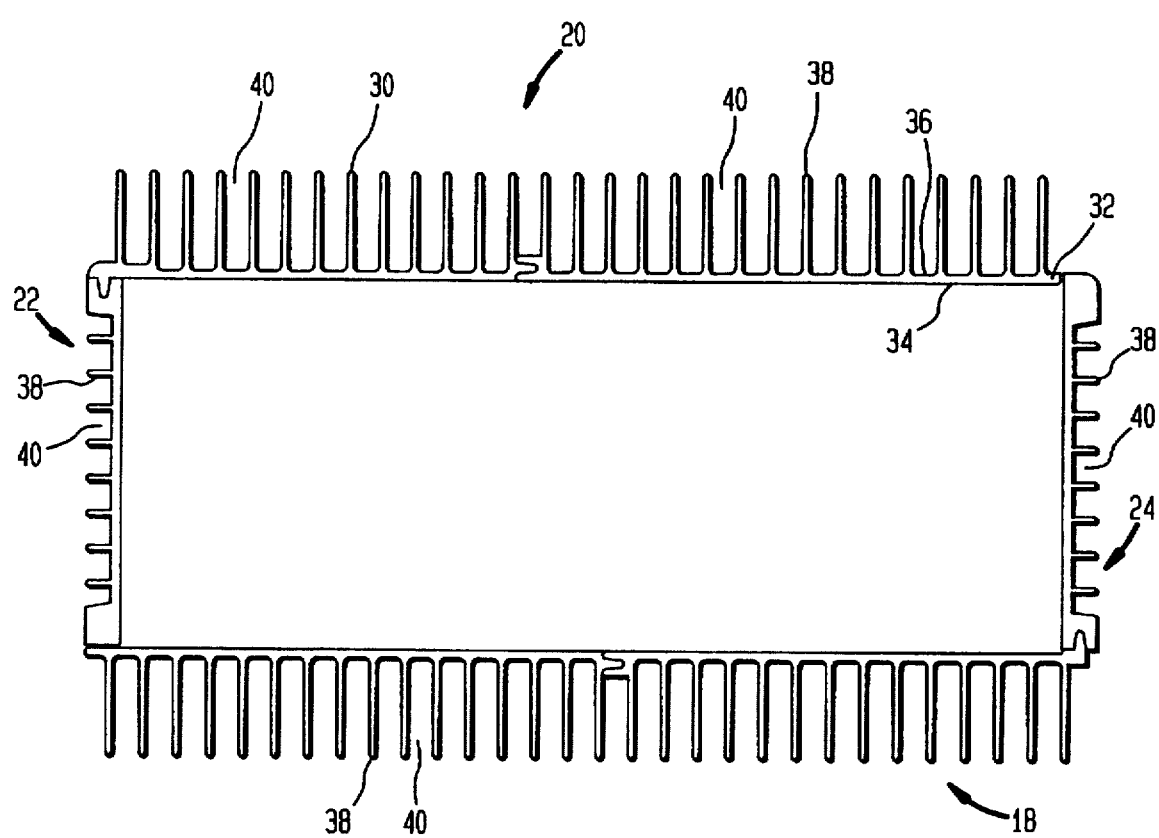
Figure 6:
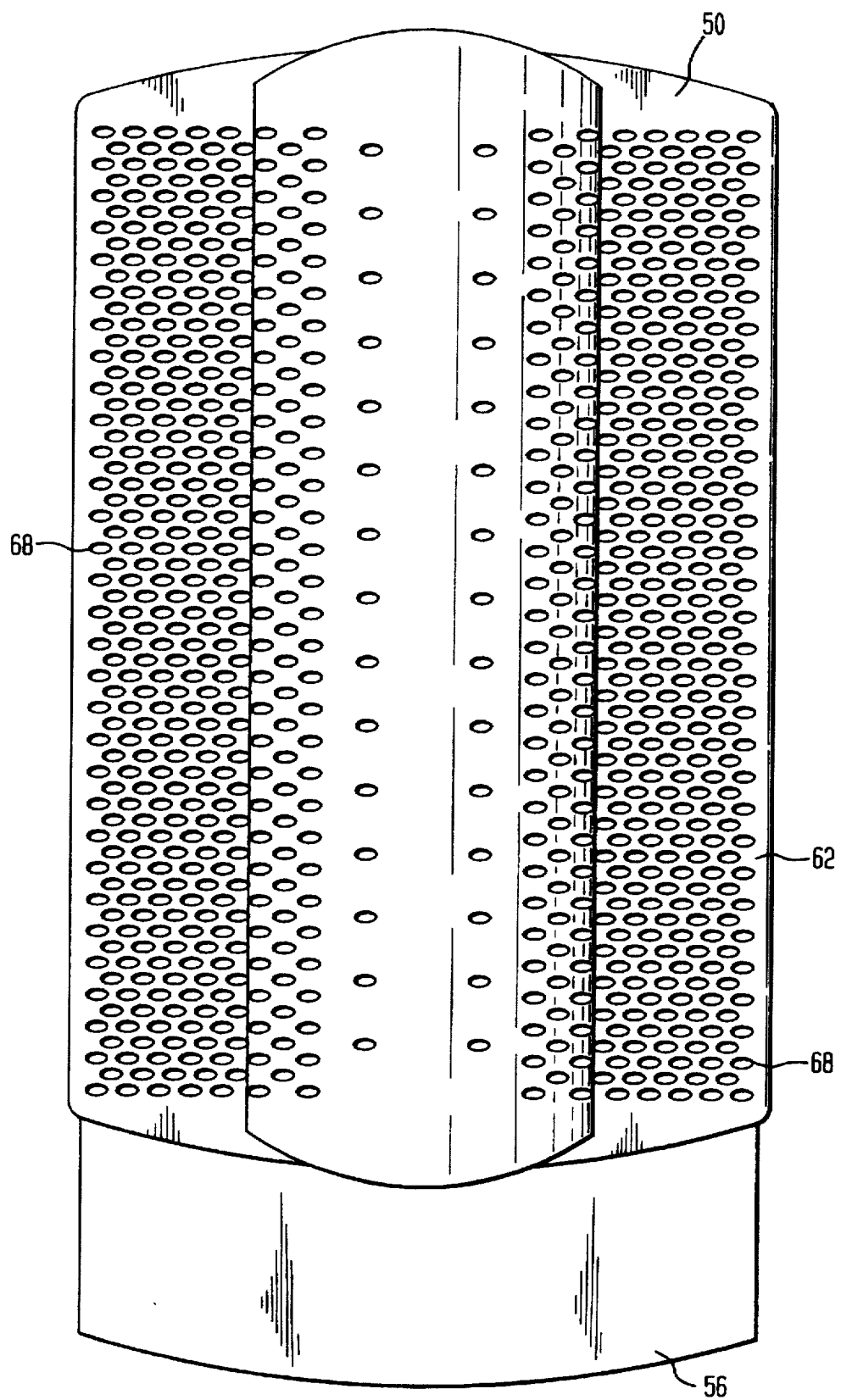
FIGS. 6–9 depict a front, a side, a top, and a top cross sectional view of the microcell of FIG. 1
Figure 7:
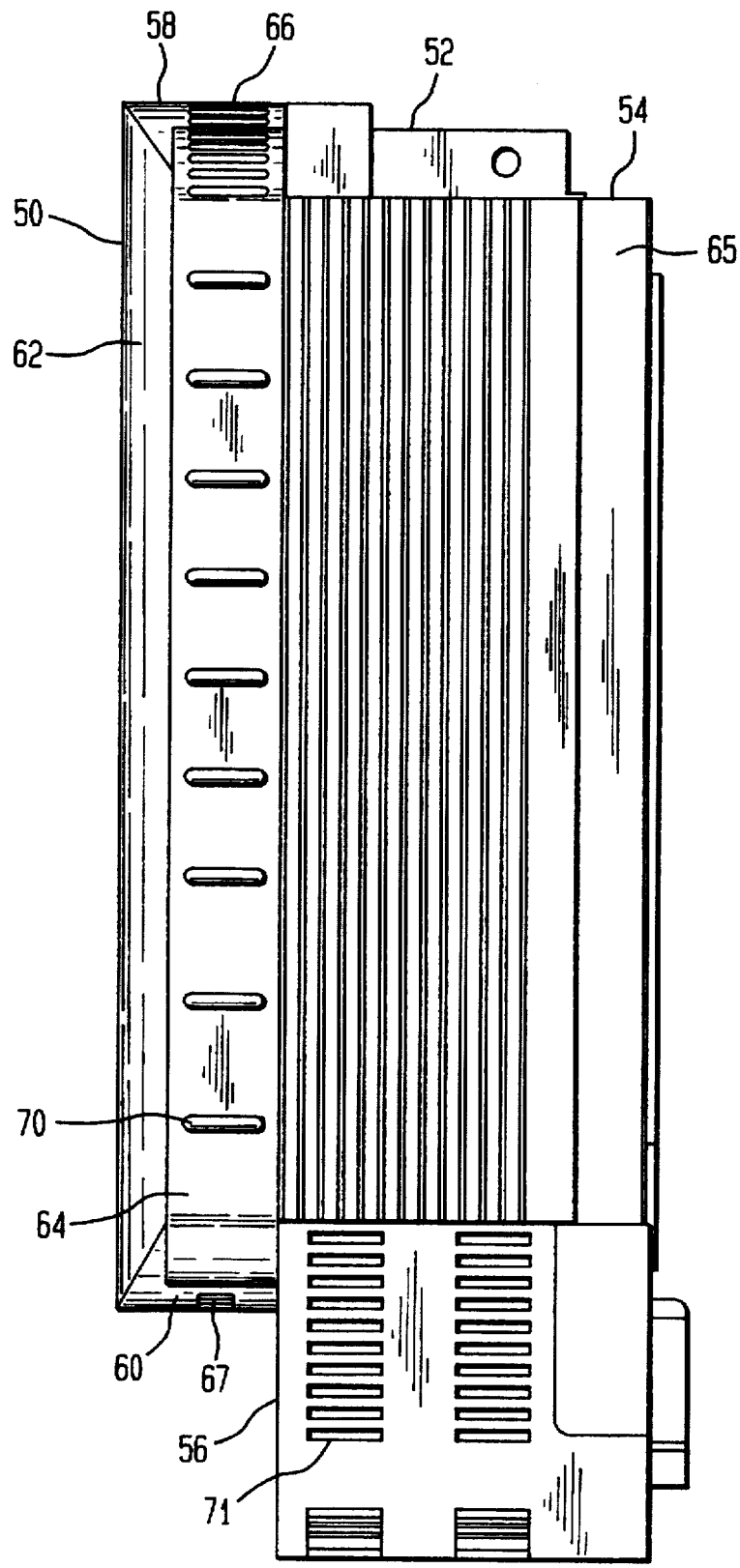
Figure 8:
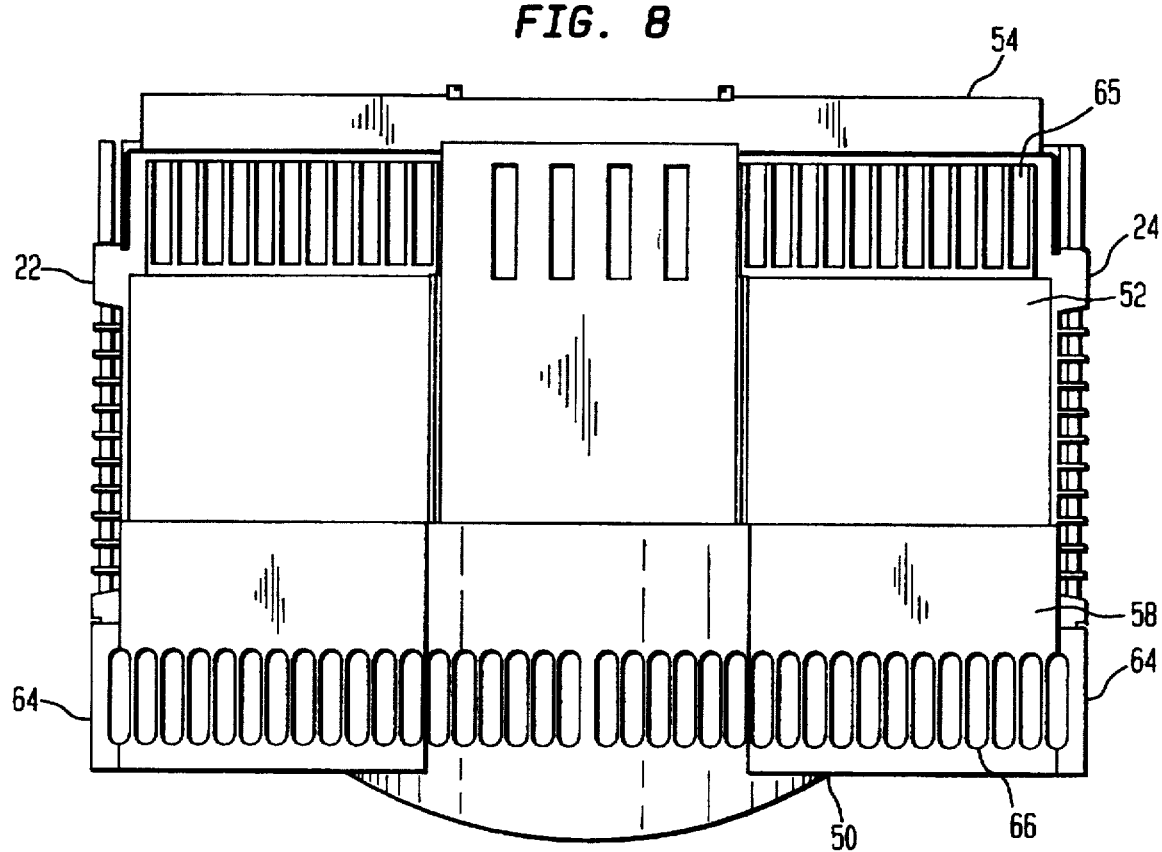
Figure 9:
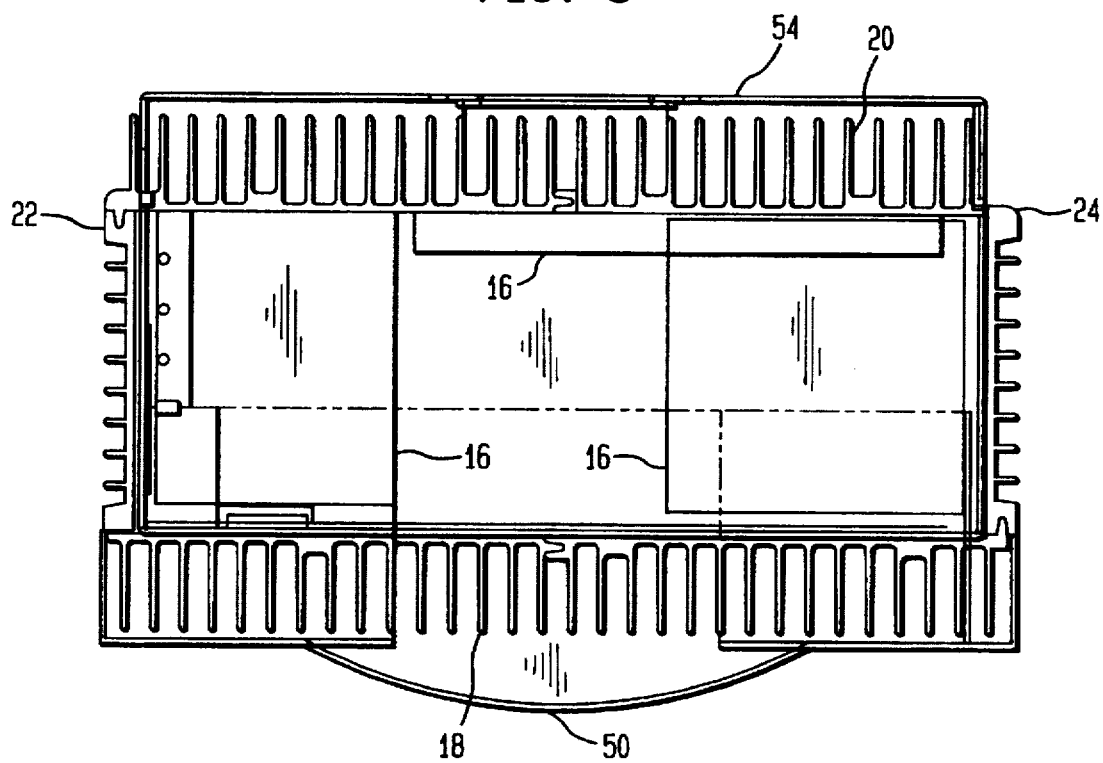

In one embodiment, the front, rear, and first and second side panels 18, 20, 22, 24 are heat sinks for absorbing and dissipating heat generated by the base station electronic components 16. Preferably, the heat sinks are formed from a highly heat conductive metal, such as cast aluminum. Referring to FIGS. 3–5, there are shown a front, a side, and a top view of the microcell 10, respectively, without the solar shield 14 (or the electronic components) in accordance with this embodiment of the present invention. As shown in FIGS. 3–5, each heat sink comprises a plate 32 having an interior side 34 to which the base station electronic components 16 are mounted and an exterior side 36 having a plurality of fins 38. The fins 38 project laterally outward from the exterior side 36 and form channels 40 (referred to herein as longitudinal channels) between through which cooling air may pass. In one embodiment, the fins 38 are parallel to each other and aligned longitudinally with respect to the prevalent direction of airflow. In an embodiment where the prevalent direction of airflow is uncertain, the exterior side 36 of the heat sink has pins (not shown) instead of fins.

In one mode of operation, the heat absorbed by the heat sinks is dissipated by natural convection, i.e., process by which heat absorbed by the heat sink is carried away by a relatively high speed flow of air through the longitudinal channels (as opposed to a relatively slow speed flow of air above the longitudinal channels). In another mode of operation, forced convection is used to dissipate the heat absorbed by the heat sink. In this latter mode of operation, the microcell 10 includes fans 72 which facilitate the flow of air through the heat sinks.

In an embodiment of the present invention, the fins 38 on the front and rear panels 18, 20 have parallel side cuts or grooves through them that form channels 42 (referred to herein as cross channels) which can facilitate the cooling process of the microcell. In one embodiment, the cross channels 42 are normal to the longitudinal channels 40, and allow for the passage of cross winds through the heat sink while permitting fresh air to be drawn into the longitudinal channels 40 (through the cross channels 42) during the convection process. The dimensions for the heat sinks, in an embodiment of the present invention, are as follow: the plate 32 has a thickness of 4 mm; the fins 38 project 30 mm outward and have a thickness of 3 mm; the channels have a width of 15 mm; and each longitudinal and cross channel 40, 42 are spaced 15 and 50 millimeters apart, respectively.

The solar shield 14 shelters the microcell 10 from solar heat (e.g., can cut heat load within the microcell by 70% or more) and, in one embodiment, is adapted to fit over the front, rear, top and bottom panels 18, 20, 26, 28 of the housing 12. Typical prior art solar shields would normally disrupt or impede the flow of air into the heat sinks, thereby adversely affecting the convection process of the heat sinks. The solar shield of the present invention is designed, however, to maximize sheltering the microcell from solar heat while minimizing disruption to the convection process, as will be described herein. In one embodiment, the solar shield is constructed using molded plastic or sheet metal.

FIGS. 6–9 depict a front, a side, a top, and a top cross sectional view of the microcell 10 in accordance with one embodiment of the present invention. As shown in FIGS. 6–9, the solar shield 14 comprises a front solar shield 50, a top solar shield 52, a rear solar shield 54, and a skirt 56 for sheltering the front, top, rear and bottom panels 18, 26, 20, 28, respectively, from solar heat. The front solar shield 50 includes a top wall 58, a bottom wall 60, a face 62, and side walls 64. The top and bottom walls 58, 60 have top and bottom ventilators 66, 67, such as slots or openings, which align with the longitudinal channels 40 of the front panel 58, thereby allowing for the necessary airflow passage associated with the convection process (i.e., chimney effect) through the longitudinal channels 40. The face 62 has ventilators 68, such as perforations or apertures, which align with the cross and longitudinal channels 40, 42 of the front panel 18 such that fresh air may be drawn into the heat sink (of the front panel) through the face 62 during the convection process. In one embodiment, the face ventilators 68 have an aspect ratio which minimizes solar input while maximizing cool air input—for example, the height of the face ventilator is less than or equal to the thickness of the face. The side walls 64 have side ventilators 70, such as slots or openings, which align with the cross channel 42 to allow fresh air to be drawn into the heat sink (of the front panel) through the cross channels 42 during the convection process. In one embodiment, the size of the top, bottom, face, and side ventilators 66, 67, 68, 70 are designed to achieve a desired cooling effect for the microcell.

Generally, the fins 38 would be aligned longitudinally with the prevalent direction of the wind to increase the efficiency of the convection process. In such a situation, it would not be intuitive to have face and side ventilators 68, 70 in the front solar shield because such features would disrupt the convection process by slowing the flow of air through the longitudinal channels 40. However, the prevalent direction of airflow changes due to the random nature of wind direction. This randomness may, in some instances, lead to the creation of high pressure domes around the microcell in the absence of the face and side ventilators 68, 70 that is, if there are no face or side ventilators, wind blowing on the side or face of the microcell would cause a high pressure dome to be created around the microcell. Such dome would impede fresh air from entering the heat sinks through the top and bottom ventilators 66, 67, which may lead to the electronic components overheating. The face and side ventilators 68, 70 function as pressure equalizers by allowing air to be pushed from the higher pressure side of the dome to the lower pressure side. This prevents the disruption by high pressure domes, thereby removing any impedance associated with high pressure domes to fresh air entering the heat sink through the top and bottom ventilators 66, 67 (while allowing fresh air to enter the heat sinks through the face and side ventilators).

In one embodiment, the rear solar shield 54 includes the same features as the front solar shield 50 with respect to the rear panel 20—that is, the rear solar shield 54 has a face, top, bottom and side walls with ventilators 65. In another embodiment of the present invention, the top solar shield 52 has no ventilators and directs airflow from the front panel 18 to the rear panel 20, whereas the skirt 56 has ventilators 71 and protects the base station electronic components 26 mounted to the underside of the bottom panel 28 from solar heat and other natural elements.

Figure 10:
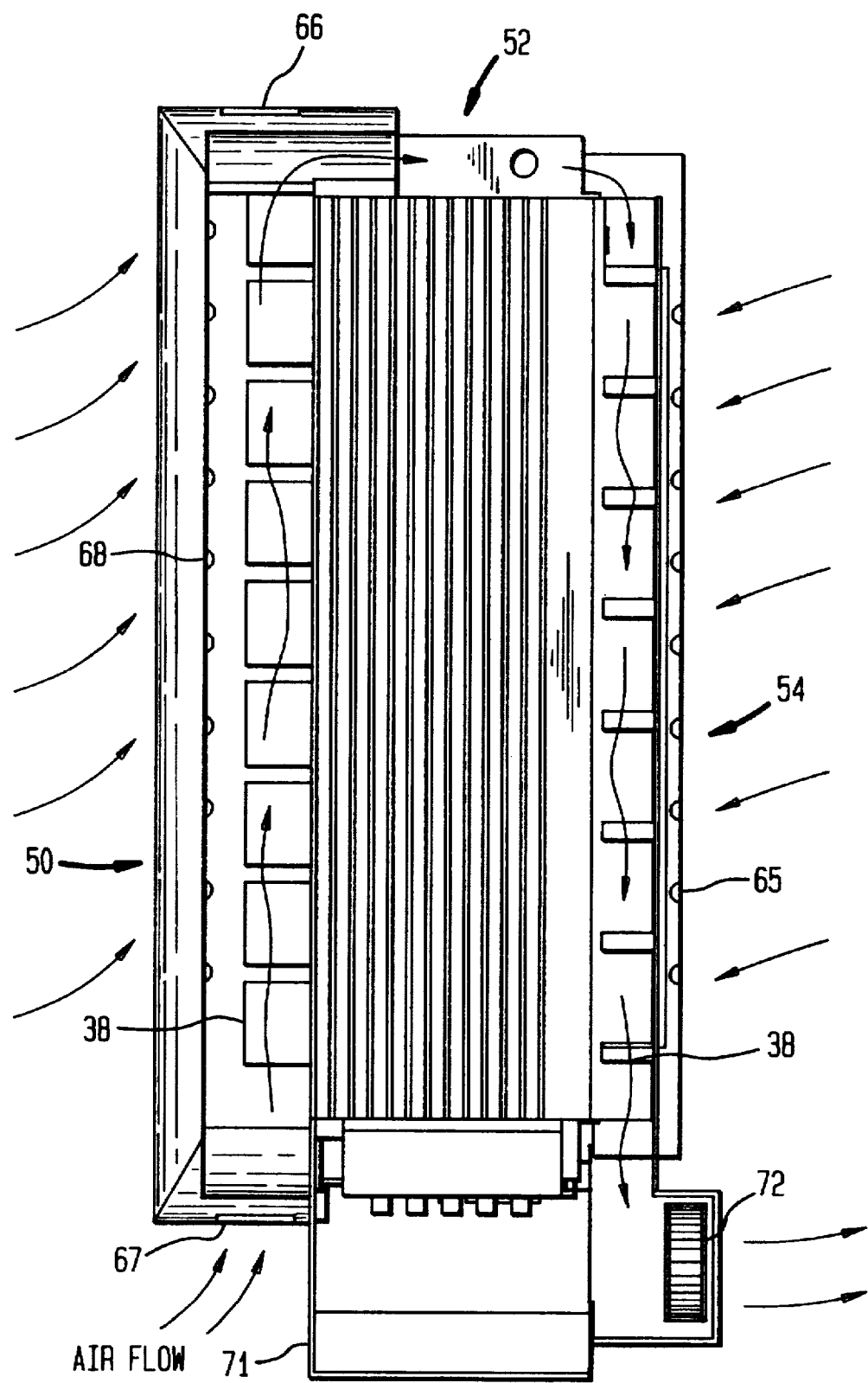
FIG. 10 depicts a side cross sectional view of the microcell of FIG. 1 illustrating the path of the airflow through the microcell using forced convection.

FIG. 10 depicts a side cross sectional view of the microcell 10 illustrating the path of the airflow through the microcell using forced convection. As shown in FIG. 10, air is drawn in through the bottom ventilators 67 and travels through the longitudinal channels dissipating heat absorbed by the heat sink (of the front panel), i.e., convection process. As the air flow through the longitudinal channel, it draws fresh air in through the face ventilators 68 and side ventilators (using the cross channels), not shown. Upon exiting the top of the heat sink (of the front panel), fresh air is drawn in through the top ventilators 66 and mixed with the old air as it passes over the top panel 26 and enters the longitudinal channels of the rear panel. Like the front panel, the flow of air through the longitudinal channels of the rear panel causes air to be drawn into the longitudinal channels through the ventilators 65 of the rear solar shield 54 before being exhausted by the fans 74. Note that the top ventilators 66 also functions as a metering device for airflow during forced convection. The amount of fresh air drawn into the microcell during forced convection can be controlled by the size of the top ventilators 66 and the speed of the fans 72. In other words, the ratio of air drawn in through the front solar shield 50 is determined, in part, by the size of the slots 66.

In some instances, the cooling scheme of the microcell may be too efficient, and the base station electronic components within the housing may fall below a desired temperature, e.g., 0° C., causing the base station electronic components to perhaps malfunction. In such a situation, heaters 73 may be needed to maintain a minimum temperature within the housing. These heaters at times operate on a backup power supply. Such use of the backup power supply is undesirable because it may leave the power supply with insufficient energy to power other electronic components in the microcell in the event of a main power failure.

To prevent overcooling of the microcell, the present invention includes a regulating device for managing the volume of air flowing through the microcell. In one embodiment, the regulating device controls the size of the ventilators in the solar shields. By controlling the size of the ventilators, the volume of air flowing into the microcell can be decreased (or increased), thereby decreasing (or increasing) the efficiency of heat dissipation and causing the microcell temperature to elevate (or decline).

Figure 11:
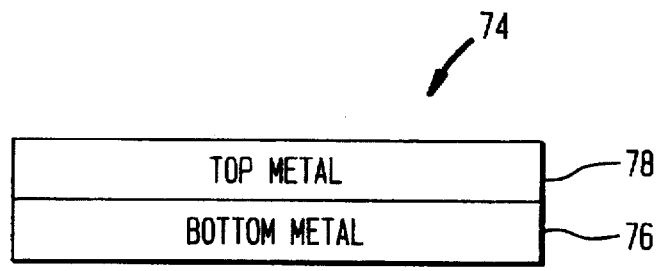
FIG. 11 depicts an embodiment of a regulating device comprising a plurality of bi-metal foils with a bottom metal layer and a top metal layer.

In one embodiment, the regulating device is a plurality of bi-metal foils, which are foils with two layers of metal. FIG. 11 depicts a bi-metal foil regulating device 74 with a bottom metal layer 76 and a top metal layer 78. Each of the metal layers 76, 78 have associated <temperature coefficient. The bottom metal layer 76 is constructed using a metal B with a temperature coefficient $\alpha_B$. The top metal layer 78 is constructed using a metal T with a temperature coefficient $\alpha_T$, wherein $\alpha_T$ is less than $\alpha_B$. In an embodiment of the present invention, the high expansion metal, i.e., top metal layer, is a high expansion "19-2" alloy comprising of 0.55 C, 1.00 Mn, 0.20 Si, 2 Cr, 19 Ni, and Bal. Fe, and the low expansion metal, i.e., bottom metal layer, is a metal known by the tradename "carpenter low expansion '45'" alloy comprising 0.05 C, 0.4 Mn, 0.25 Si, 45.00 Ni, and Bal. Fe. Note that the regulating device could also be a foil having non-metal layers with the same thermal coefficient properties as the bi-metal foil.

Figure 12:
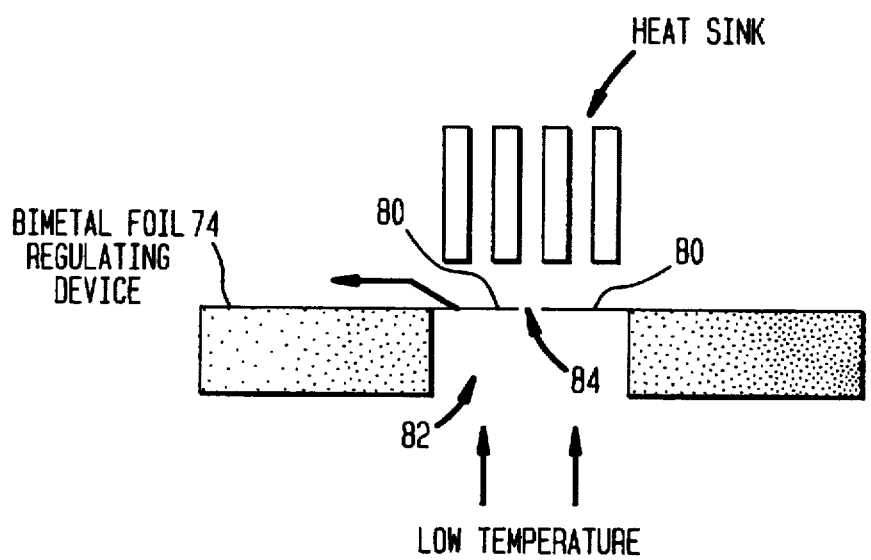
FIGS. 12 and 13 depict the regulating device of FIG. 11 over a ventilator at low temperatures and at normal temperatures.
Figure 13:
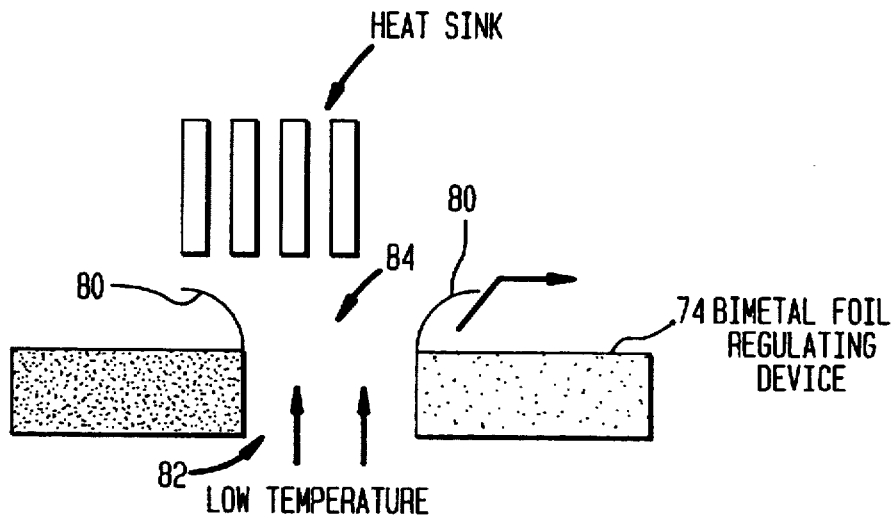

Referring to FIGS. 12 and 13, there is shown a bi-metal foil regulating device 74 over a ventilator 82 at low temperatures and at normal temperatures, respectively. For purposes of describing the operation of the bi-meal foil regulating device 74, the term "low temperatures" is defined as temperatures lower than the temperature coefficient $\alpha_T$ of the top metal layer 78, and normal temperatures is defined as temperatures higher than the temperature coefficient $\alpha_T$ of the top metal layer 78 but lower than the temperature coefficient $\alpha_B$ of the bottom metal layer 76. As shown in FIG. 12, the bi-metal foil regulating device 74 includes a plurality of bi-metal foil strips 80 positioned over each side and extending towards the center of the ventilator 82 leaving a gap 84, wherein the size of gap 84 determines the amount the ventilator 82 is constricted. At low temperatures, the bi-metal foil regulating device 74 is flat over the ventilator 82, thereby constricting the airflow into the heat sink through the ventilator 82 that is, the size of the ventilator is effectively reduced to the size of the gap 84. As shown in FIG. 13, at normal temperatures, the bi-metal foil regulating device 74 curls back fully or partially, thereby widening the gap 84—that is, the top metal layer (but not the bottom metal layer) expands causing the bi-metal foil to curl back. In another embodiment, the regulating device can be any device that constricts airflow, such as a retractable plate or plug that widens or narrows the ventilators.

Although the present invention has been described in considerable detail with reference to certain embodiments, other versions are possible. Therefore, the spirit and scope of the present invention should not be limited to the description of the embodiments contained herein.

The invention claimed is:

1. An enclosure for cooling heat generating devices contained within the enclosure, the enclosure comprising:

a housing having a plurality of heat sinks for absorbing and dissipating heat generated by the devices, each of the plurality of heat sinks including an interior side to which the devices are mounted and an exterior side having a plurality of fins that forms first channels and second channels; and a solar shield positioned over the heat sinks for sheltering the housing from solar heat, the solar shield having ventilators which align with the first and second channels for allowing heat absorbed by the heat sinks to be dissipated.

2. The enclosure of claim 1, wherein the plurality of fins are parallel with respect to each other forming the first channels, the plurality of fins having side cuts that form the second channels.

3. The enclosure of claim 1, wherein the heat sinks are constructed from cast aluminum.

4. The enclosure of claim 1, wherein the solar shield has a face, a top wall, a bottom wall and side walls.

5. The enclosure of claim 4, wherein the ventilators comprise slots in the top and bottom walls that are aligned with the first channels.

6. The enclosure of claim 4, wherein the ventilators comprise slots in the side walls that are aligned with the second channels.

7. The enclosure of claim 5, wherein the ventilators comprise apertures in the face that are aligned with the first channels.

8. The enclosure of claim 1, wherein the solar shield is constructed from plastic.

9. The enclosure of claim 8 further comprising:

a regulating device for constricting airflow through the heat sinks.

10. The enclosure of claim 8, wherein the regulating device is a bimetal foil having a top metal layer T with a temperature coefficient $\alpha_T$ and a bottom metal layer B with a temperature coefficient $\alpha_B$, the temperature coefficient $\alpha_T$ being less than the temperature coefficient $\alpha_B$.

11. The enclosure of claim 1 further comprising:

a heater for maintaining a minimum temperature in the housing.

12. The enclosure of claim 1 further comprising:

a fan for facilitating airflow through the heat sinks.

13. The enclosure of claim 12, wherein the fans draw in air through the ventilators.

14. The enclosure of claim 1 further comprising:

a plurality of associated electronic components mounted to the interior side of the heat sinks.

* * * * *